(12) United States Patent
Waki

(10) Patent No.: US 8,846,217 B2
(45) Date of Patent: Sep. 30, 2014

(54) SURFACE-COATED TOOL

(75) Inventor: Masahiro Waki, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 459 days.

(21) Appl. No.: 13/126,461

(22) PCT Filed: Oct. 19, 2009

(86) PCT No.: PCT/JP2009/067981
§ 371 (c)(1),
(2), (4) Date: Apr. 27, 2011

(87) PCT Pub. No.: WO2010/050374
PCT Pub. Date: May 6, 2010

(65) Prior Publication Data
US 2011/0206470 A1   Aug. 25, 2011

(30) Foreign Application Priority Data

Oct. 28, 2008   (JP) ................................. 2008-276386

(51) Int. Cl.
*B32B 9/00*   (2006.01)
*B32B 18/00*  (2006.01)
*B24D 3/00*   (2006.01)
*C23C 14/32*  (2006.01)
*C23C 14/34*  (2006.01)
*C23C 14/06*  (2006.01)
*C23C 14/50*  (2006.01)
*B23P 15/28*  (2006.01)

(52) U.S. Cl.
CPC .......... *C23C 14/0641* (2013.01); *C23C 14/325* (2013.01); *C23C 14/3414* (2013.01); *C23C 14/505* (2013.01)
USPC ............. 428/699; 428/325; 428/698; 51/307; 51/309; 407/119

(58) Field of Classification Search
None
See application file for complete search history.

(56) References Cited

U.S. PATENT DOCUMENTS

| 4,714,660 | A | * | 12/1987 | Gates, Jr. ...................... 428/698 |
| 5,945,207 | A | * | 8/1999 | Kutscher et al. .............. 428/216 |
| 2004/0161639 | A1 | | 8/2004 | Fukano et al. ................ 428/698 |
| 2006/0154108 | A1 | * | 7/2006 | Fukui et al. .................... 428/698 |
| 2008/0160338 | A1 | * | 7/2008 | Tanibuchi et al. ............. 428/627 |
| 2008/0178535 | A1 | * | 7/2008 | Wan ................................ 51/297 |

FOREIGN PATENT DOCUMENTS

| JP | 08-118105 | * | 5/1996 | ............. B23B 27/14 |
| JP | 0818105 | * | 5/1996 | ............. B23B 27/14 |
| JP | 10-315011 | | 12/1998 | |
| JP | 2001-293601 | | 10/2001 | |

(Continued)

*Primary Examiner* — Gwendolyn Blackwell
*Assistant Examiner* — Seth Dumbris
(74) *Attorney, Agent, or Firm* — DLA Piper LLP (US)

(57) ABSTRACT

Provided is a surface-coated tool, such as a cutting tool, in which a surface of a substrate 2 is coated with a coating layer 6. The coating layer 6 comprises a lower layer 8 and an upper layer 9. The lower layer 8 and the upper layer 9 are both composed of columnar particles 10 extending vertically with respect to the surface of the substrate 2. The mean crystal width of the columnar particles 10b constituting the upper layer 9 is smaller than the mean crystal width of the columnar particles constituting the lower layer. Dispersed particles containing tungsten exist in both the lower layer and the upper layer. The distribution density of the dispersed particles existing in the upper layer is smaller than the distribution density of the dispersed particles existing in the lower layer. The surface-coated tool includes the coating layer to improve wear resistance and fracture resistance.

7 Claims, 4 Drawing Sheets

(56) References Cited

FOREIGN PATENT DOCUMENTS

| JP | 2002-256967 | 9/2002 |
| JP | 2004-306246 | 11/2004 |
| JP | 2005-199420 | 7/2005 |
| JP | 2006-111915 | 4/2006 |
| WO | WO 2008/078592 A1 | 7/2008 |

\* cited by examiner

SURFACE-COATED TOOL

CROSS-REFERENCE TO THE RELATED APPLICATIONS

This application is a national stage of international application No. PCT/JP2009/067981, filed on Oct. 19, 2009, and claims the benefit of priority under 35 USC 119 to Japanese Patent Application No. 2008-276386, filed on Oct. 28, 2008, the entire contents of which are incorporated herein by reference.

TECHNICAL FIELD

The present invention relates to a surface-coated tool having a coating layer formed on a surface of a substrate.

BACKGROUND ART

At the present time, tools, for example, wear resistant tools, sliding members and cutting tools, such as cold forging and hot forging tools, e.g., punches and headers, require wear resistance, sliding properties, and fracture resistance. These tools employ the technique to improve wear resistance, sliding properties, and fracture resistance by forming different coating layers onto a surface of a substrate made of a hard material, such as WC-based cemented carbide, TiCN-based cermet, ceramics, diamond, or cBN.

As the coating layer, a TiCN layer and a TiAlN layer are generally widely employed, whereas various improvements are made to enhance wear resistance and fracture resistance.

For example, patent document 1 describes a cutting tool in which a surface of a substrate is coated with a wear resistant coating containing at least one extremely high hardness ultrafine particulate compound selected from the group consisting of $B_4C$, BN, $TiB_2$, TiB, TiC, WC, SiC, $SiN_x$ (x=0.5 to 1.33), and $Al_2O_3$. The document discloses that the hardness of the coating is improved by containing the ultrafine particulate compound. Patent document 2 discloses a coating layer composed of elongated TiAlN crystals having an average value of 1.5 to 7 in the aspect ratio of the crystal width, and describes that the coating layer has excellent wear resistance and oxidation resistance. Patent document 3 discloses a tool with hard coatings having different compositions deposited on a surface of a substrate.

PRIOR ART DOCUMENTS

Patent Documents

Patent document 1: Japanese Unexamined Patent Publication No. 2001-293601
Patent document 2: Japanese Unexamined Patent Publication No. 10-315011
Patent document 3: Japanese Unexamined Patent Publication No. 2005-199420

SUMMARY OF THE INVENTION

Problems to be Solved by the Invention

However, the coating layer containing the high hardness ultrafine particulate compound as disclosed in the patent document 1 has insufficient toughness. Hence there is a desire for a coating layer having excellent toughness and fracture resistance. The patent document 1 also describes that the crack propagation progressed into the coating layer due to energy dispersion within the coating layer can be suppressed by bringing the ultrafine particulate compound into an amorphous substance of the high hardness compound. However, when the ultrafine particulate compound is the amorphous substance, the toughness improving effect is small. It was found that there was a need for further improving fracture resistance. It was also found that the coating layer composed of the elongated crystals as disclosed in the patent document 2 had a limit to the improvement of wear resistance. It was further found that the laminated structure made up of the two coating layers having different compositions also requires further improvement in the fracture resistance of the coating layers.

Therefore, an object of the surface-coated tool of the present invention is to solve the above problems by providing the tool having high wear resistance and high fracture resistance.

Means for Solving the Problems

A surface-coated tool of the present invention comprises a substrate and a coating layer coating a surface of the substrate. The coating layer includes a lower layer and an upper layer. The lower layer and the upper layer are both composed of columnar particles extending vertically with respect to the surface of the substrate. The mean crystal width of the columnar particles of the upper layer being smaller than the mean crystal width of the columnar particles of the lower layer. The lower layer and the upper layer both comprise dispersed particles containing tungsten. The distribution density of the dispersed particles existing in the upper layer is smaller than the distribution density of the dispersed particles in the lower layer.

Preferably, the mean particle diameter of the dispersed particles in the upper layer is smaller than the mean particle diameter of the dispersed particles in the lower layer. Preferably, the dispersed particles existing in the lower layer contain more tungsten than the dispersed particles existing in the upper layer.

Preferably, the elastic recovery rate, which is found by a hardness measurement using nanoindentation method, on the surface of the coating layer is 40 to 50%.

Effect of the Invention

According to the surface-coated tool of the present invention, the lower layer and the upper layer are both composed of the columnar particles extending vertically with respect to the surface of the substrate. The mean crystal width of the columnar particles constituting the upper layer is smaller than the mean crystal width of the columnar particles constituting the lower layer. The dispersed particles containing tungsten exist in both the lower layer and the upper layer. The distribution density of the dispersed particles existing in the upper layer is smaller than the distribution density of the dispersed particles existing in the lower layer. Owing to all these features, the hardness and oxidation resistance of the coating layer are improved, and the adhesion of the coating layer is enhanced.

The mean particle diameter of the dispersed particles existing in the upper layer is preferably smaller than the mean particle diameter of the dispersed particles existing in the lower layer, in terms of improved peeling resistance and chipping resistance of the coating layer.

The dispersed particles existing in the lower layer preferably contain more tungsten than the dispersed particles existing in the upper layer, in order to enhance the adhesion of the coating layer.

The elastic recovery rate, which is found by the hardness measurement using nanoindentation method, on the surface of the coating layer is preferably 40 to 50% in terms of enhanced toughness and strength of the coating layer, and enhanced chipping resistance and fracture resistance of the coated tool during cutting.

EMBODIMENTS FOR CARRYING OUT THE INVENTION

An example of the surface-coated tool of the present invention is described with reference to FIGS. 1(a) and 1(b), which are the schematic perspective view and the schematic cross section of the cutting tool as a suitable exemplary embodiment, respectively.

Figure 1:
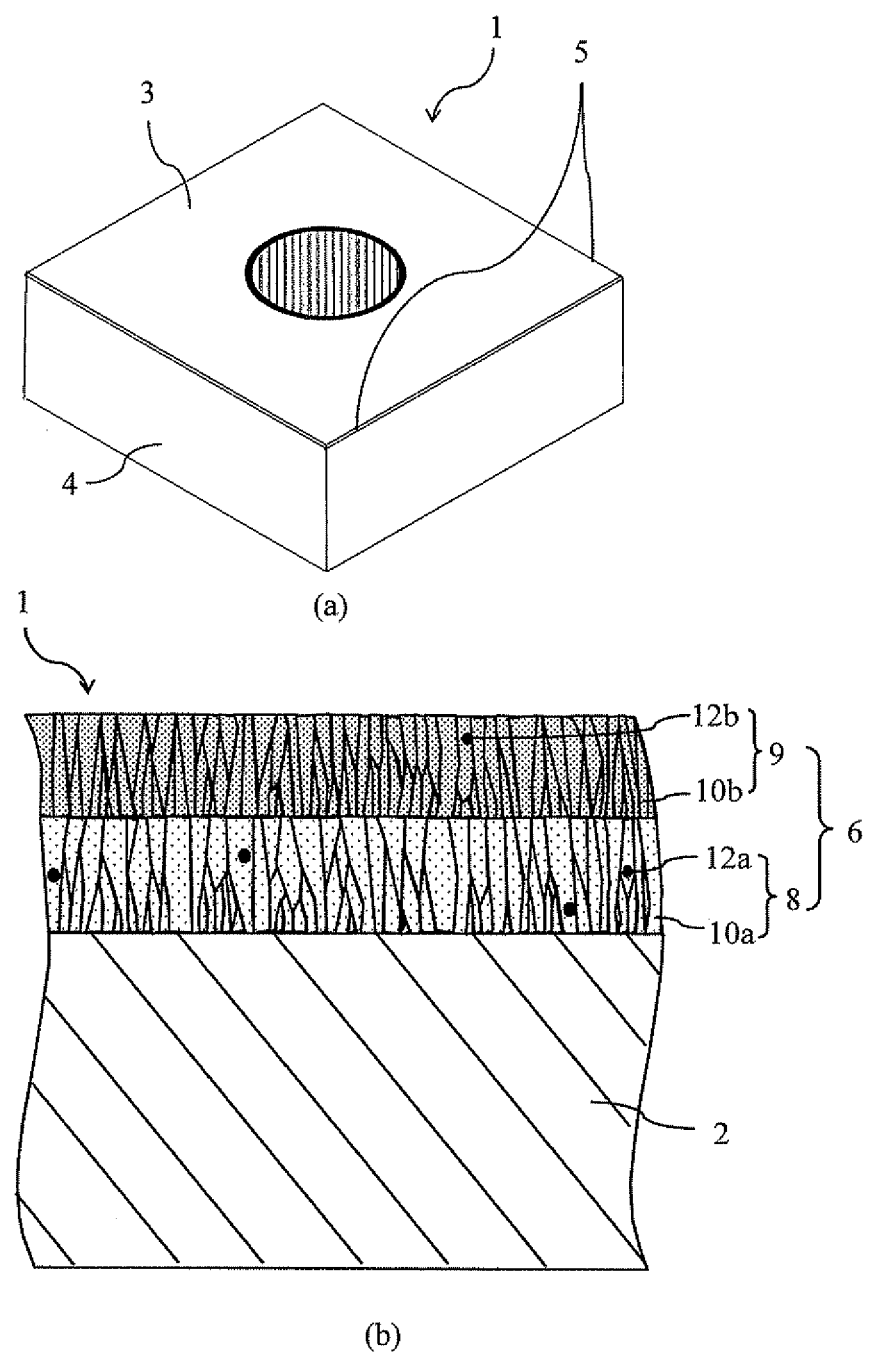
FIG. 1(a) is a schematic perspective view showing an example of a throwaway tip shaped cutting tool as a suitable example of the surface-coated tool of the present invention.
FIG. 1(b) is a schematic cross section thereof.

Referring to FIGS. 1(a) and 1(b), the cutting tool 1 of the present invention has a rake face 3 on a main surface, a flank face 4 on a side face, and a cutting edge 5 on a cross ridge between the rake face 3 and the flank face 4. A coating layer 6 is deposited on a surface of the substrate 2.

As shown in FIG. 1(b), the coating layer 6 includes a lower layer 8 and an upper layer 9. The lower layer 8 and the upper layer 9 are both composed of columnar particles 10 (10a, 10b) extending vertically with respect to the surface of the substrate 2. The mean crystal width of the columnar particles 10b constituting the upper layer 9 is smaller than the mean crystal width of the columnar particles 10a constituting the lower layer 8. Dispersed particles 12 (12a, 12b) containing tungsten exist in both the lower layer 8 and the upper layer 9. The distribution density of the dispersed particles 12b existing in the upper layer 9 is smaller than the distribution density of the dispersed particles 12a existing in the lower layer 8.

Owing to the above structure, the hardness and oxidation resistance of the coating layer 6 are improved, and the adhesion of the coating layer 6 is enhanced. That is, when the mean particle diameter of the columnar particles 10b constituting the upper layer 9 is larger than or equal to the mean particle diameter of the columnar particles 10a constituting the lower layer 8, the hardness of the coating layer 6 is lowered, and the oxidation resistance thereof is also deteriorated. When the dispersed particles 12 containing tungsten are absent in both the lower layer 8 and the upper layer 9, the chipping resistance of the coating layer 6 is lowered. When the distribution density of the dispersed particles 12b existing in the upper layer 9 is larger than or equal to the distribution density of the dispersed particles 12a existing in the lower layer 8, the adhesion of the coating layer 6 is deteriorated, and the coating layer 6 might be partially peeled.

In the present invention, the crystals specified as crystals, whose crystal length in a direction vertical to the surface of the substrate 2 is 1.5 times longer than the crystal width in a direction parallel to the surface of the substrate 2, are defined as the columnar particles 10. When the coating layer 6 is not composed of the columnar particles 10, the toughness of the tool 1 is lowered.

When the mean crystal width (an average value of the crystal widths in the direction parallel to the surface of the substrate 2, namely, in the direction of the laminated surfaces of the lower layer and the upper layer) of the columnar particles 10 is 0.05 μm or above, the oxidation resistance of the coating layer 6 is not lowered. On the other hand, when the mean crystal width of the columnar particles 10 is 0.3 μm or below, the hardness and fracture resistance of the coating layer 6 are enhanced. A suitable range of the mean crystal width of the coating layer 6 is 0.1 to 0.2 μm. In the present invention, the mean crystal width of the coating layer 6 is measured by drawing a line A (not shown) at a portion corresponding to an intermediate thickness of the coating layer 6 in a cross sectional photograph of the coating layer 6. Specifically, a length L (not shown) of 100 nm or above on the line A is specified, and the number of grain boundaries crossing the line A of the length L is counted. Then, the mean crystal width of the columnar particles 10 in the coating layer 6 is calculated from the length L/the number of the grain boundaries.

In a vertical direction with respect to the laminated surfaces of the lower layer 8 and the upper layer 9, the columnar particles 10 extending long in the vertical direction are formed in the coating layer 6. The laminated surfaces of the lower layer 8 and the upper layer 9 are preferably continued without discontinuity in the interface between the two adjacent columnar particles 10 and 10. This produces high effect of suppressing crack propagation, and also enhances the chipping resistance of the coating layer 6.

In the present invention, the distribution density of the dispersed particles 12 denotes the number of dispersed particles existing in an optional identical area range (provided that a comparison of the number of dispersed particles is made among three or more area ranges).

The coating layer is preferably composed of $Ti_{1-a}M_a(C_{1-x}N_x)$, wherein M is at least one selected from the group consisting of Nb, Mo, Ta, Hf, Al, Si, and Y, $35 \leq a \leq 55$, and $0 \leq x \leq 1$. Preferably, the metallic element M contains Ti and Al, each having a particularly high hardness, and also contains at least one of Nb, Mo, Ta, W, Cr, and Si.

The overall average layer thickness of the coating layer 6 is 0.8 to 10 μm. When the layer thickness falls within this range, the wear resistance of the tool 1 is high, and the fracture resistance of the coating layer 6 is not lowered while suppressing excessive rise in the internal stress of the coating layer 6. The suitable overall average layer thickness of the coating layer 6 is 1 to 6 μm.

The elastic recovery rate, which is found by a hardness test according to nanoindentation method, on the surface of the coating layer 6 is preferably 40 to 50% in terms of the enhanced toughness and strength of the coating layer, and the enhanced chipping resistance and fracture resistance of the coated tool during cutting. Hereat, the elastic recovery rate is calculated from the following measured value in the hardness measurement using the nanoindentation method (refer to W. C. Oliverand, G. m, Pharr: J. Mater. Res., Vol. 7, NO. 6, June 1992, pp. 1564-1583).

Elastic Recovery Rate $R=(H\max-Hf)/H\max\times100(\%)$, wherein Hmax is a maximum indentation depth, and Hf is an indentation depth after unloading In the hardness test according to the nanoindentation method in the present invention, by using a microindentation hardness tester with a trigonal pyramid diamond indenter having a vertex angle of 115 degrees, hardness and Young's modulus are measured from the relationship between the depth and load when the indenter is depressed. In the present invention, these measurements are made, provided that the maximum load is 130 mN and the maximum indentation depth is 500 nm.

As the substrate 2, a hard material is suitably used. Examples of the hard material include cemented carbide and cermet hard alloy which are made up of a hard phase composed mainly of tungsten carbide and titanium carbon nitride, and a binder phase composed mainly of an iron-group metal such as cobalt, nickel, or the like; ceramics composed mainly of silicon nitride and aluminum oxide; and ultra-high pressure sintered bodies formed by sintering, under an ultra-high pressure, a hard phase composed polycrystalline diamond and cubic boron nitride, and a binder phase composed of ceramics, an iron-group metal, or the like.

Figure 2:
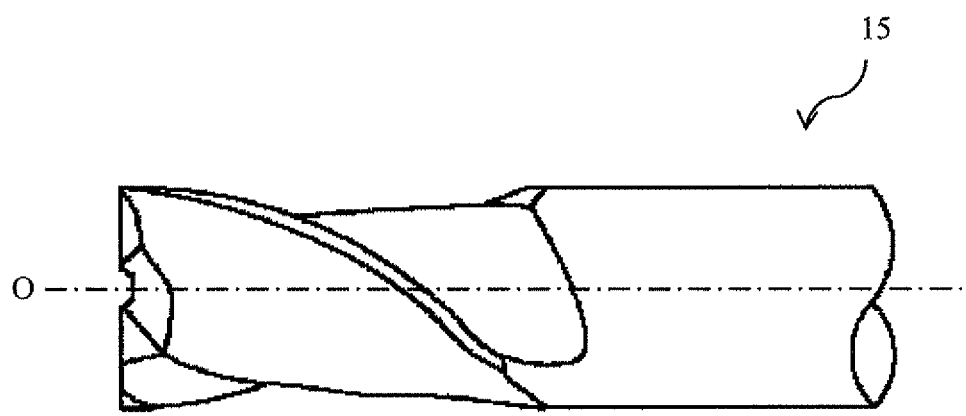
FIG. 2 is a schematic side view showing an example of an end mill shaped cutting tool as other suitable example of the surface-coated tool of the present invention.

Although the throwaway tip shaped cutting tool 1 having a substantially flat plate shape is described above by referring to FIGS. 1(a) and 1(b), the present invention is, without being limited thereto, also suitably applicable to, for example, an end mill shaped cutting tool 15 having a rotation center axis O as shown in FIG. 2. The surface-coated member of the present invention is not limited to these cutting tools, and is also suitably used in members requiring wear resistance and fracture resistance, such as wear resistant members and sliding members.

<Manufacturing Method>

A method of manufacturing the surface-coated tool of the present invention is described.

Firstly, a tool shaped substrate 2 is manufactured by using a conventionally known method. Subsequently, a coating layer 6 is formed on a surface of the substrate 2. As a method of forming the coating layer 6, physical vapor deposition (PVD) method, such as ion plating method, is suitably applied. An example of film deposition methods is described in detail by referring to FIG. 3 that is the schematic diagram of an arc ion plating film deposition device (hereinafter referred to simply as AIP device) 20, and FIG. 4 that is the schematic diagram showing the rotating state of samples in the course of the film deposition.

Figure 3:
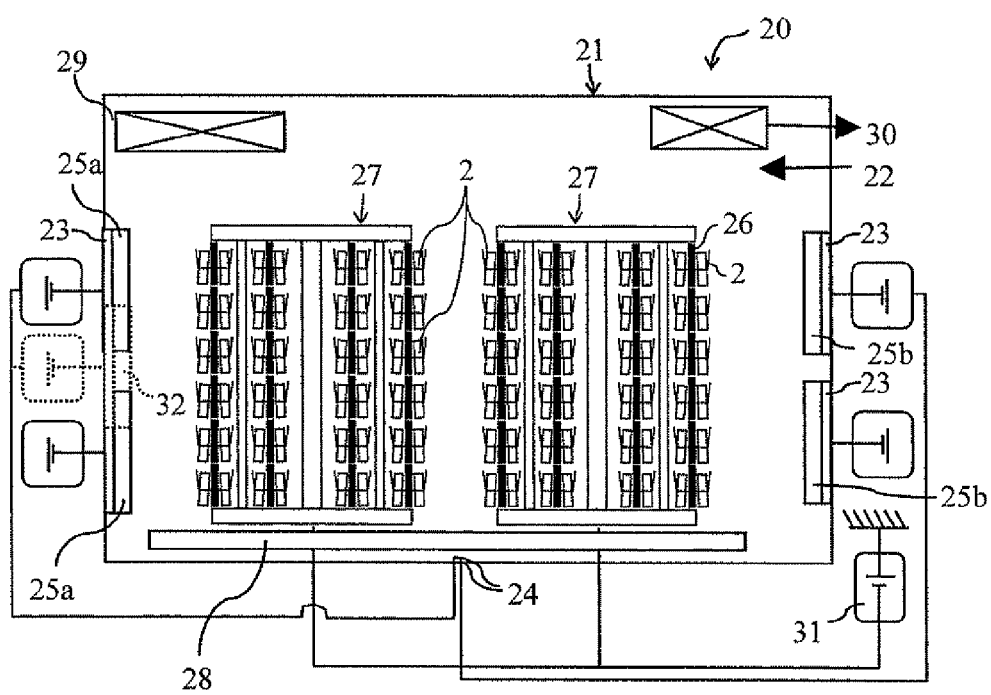
FIG. 3 is a schematic diagram of an arc ion plating deposition device in the step for forming the coating layer in manufacturing the surface-coated tool of the present invention.
Figure 4:
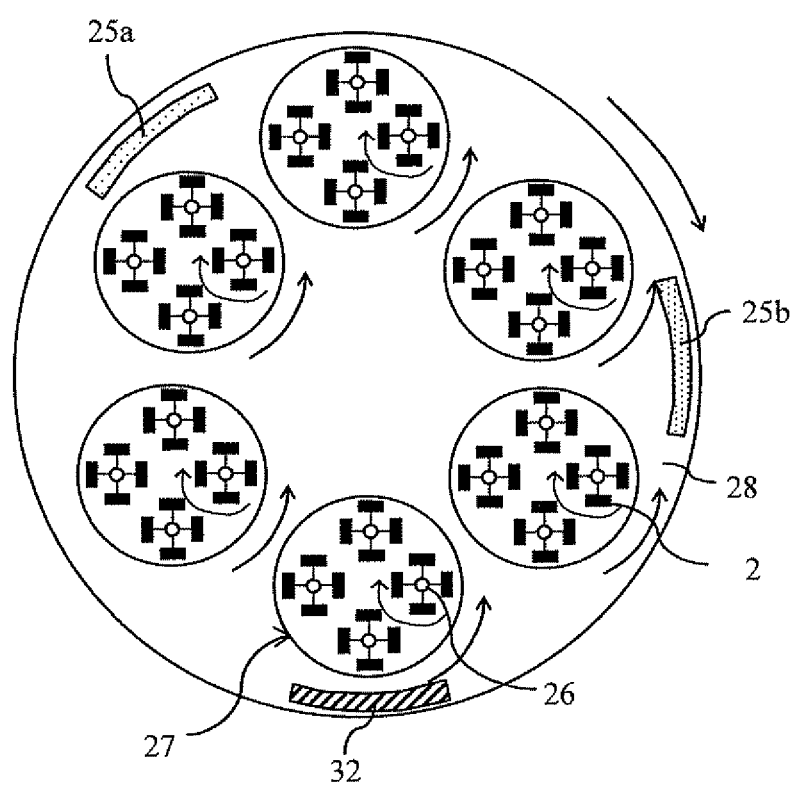
FIG. 4 is a schematic diagram showing the layout of all samples during the film deposition in the step for forming the coating layer in manufacturing the surface-coated tool of the present invention.

In the AIP device 20 of FIG. 3, gases, such as $N_2$ and Ar, are admitted through a gas inlet 22 into a vacuum chamber 21, and plasma is generated by applying a high voltage between a cathode electrode 23 and an anode electrode 24. By the plasma, a desired metal or ceramics is evaporated from main targets 25 (25a, 25b) and a sub target 32, and is then ionized and brought into a high energy state. The ionized metal is adhered to the surface of the sample (the substrate 2), thereby depositing the coating layer 6 onto the surface of the substrate 2. Referring to FIG. 3 or 4, the substrate 2 is set on sample support jigs 26. A plurality of sample supports 26 constitutes a tower 27. A plurality of towers 27 are mounted on a table 28. Referring to FIG. 3, the AIP device includes a heater 29 for heating the substrate 2, a gas discharge port 30 for discharging the gases to the exterior of the system, and a bias power supply 31 for applying a bias voltage to the substrate 2.

In the present invention, the mean crystal width of the columnar particles 10b constituting the upper layer 9 can become smaller than the mean crystal width of the columnar particles 10a constituting the lower layer 8 by controlling so that the composition of the upper layer 9 has a higher content ratio of a metal ingredient having a high vapor pressure than the composition of the lower layer 8, and by setting so that the bias voltage when depositing the upper layer 9 is higher than the bias voltage when depositing the lower layer 8. The distribution density of the dispersed particles 12b existing in the upper layer 9 can become smaller than the distribution density of the dispersed particles 12a existing in the lower layer 8 by holding the arc current applied to the main target 25 constant, and by changing the arc current applied to the sub-target 32 when depositing the lower layer 8, and when depositing the upper layer 9.

Examples of the main targets 25 include metal targets independently containing, for example, metal titanium (Ti), metal aluminum (Al), metal M (M is one or more selected from elements in Groups 4, 5, and 6 of the periodic table, except for Ti; rare earth elements; and Si), alloy targets formed by compounding them, and mixed targets composed of carbides, nitrides, boride compound powder, or sintered body of these. According to the present invention, it is desirable, in order to control the mean crystal width of the columnar crystals 12, that metal tungsten or tungsten compound is contained in the main target 25a for depositing the lower layer 8, and that neither metal tungsten nor tungsten compound is contained in the main target 25b for depositing the upper layer 9. The sub target 32 is composed mainly of tungsten.

Using the main targets 25 and the sub target 32, a metal source is evaporated and ionized by arc discharge, glow discharge, or the like, and at the same time, is reacted with nitrogen ($N_2$) gas of a nitrogen source, and methane ($CH_4$)/acetylene ($C_2H_4$) gas of a carbon source, thereby depositing the coating layer 6 onto the surface of the substrate 2.

The arc discharge, the glow discharge, or the like is used for generating plasma. As admitted gas, nitrogen ($N_2$) gas of the nitrogen source, or methane ($CH_4$)/acetylene ($C_2H_4$) gas of the carbon source can be used. The bias voltage during film deposition is preferably set at 50 to 200 V in an early stage of the film deposition, in order to manufacture the high hardness coating layer 6 in consideration of the crystal structure of the coating layer, and in order to enhance the adhesion with respect to the substrate 2.

EXAMPLE

A mixture was obtained by adding and mixing tungsten carbide (WC) powder having a mean crystal width of 0.8 μm as a main ingredient, 10% by mass of metal cobalt (Co) powder having a mean crystal width of 1.2 μm, 0.1% by mass of vanadium carbide (VC) powder having a mean crystal width of 1.0 μm, and 0.3% by mass of chrome carbide ($Cr_3C_2$) powder having a mean crystal width of 1.0 μm. The mixture was formed into an end mill (Product No. 6HFSM060-170-06, manufactured by KYOCERA CORPORATION) by press working. This was then debindered and sintered at 1450° C. in vacuum of 0.01 Pa for one hour, thereby manufacturing cemented carbide. The surface of the rake face of each sample was polished by blasting, brushing, or the like. The manufactured cemented carbide was further subjected to honing by brushing.

On the manufactured substrate, the coating layers having different compositions shown in Tables 1 and 2 were respectively formed by arc ion plating method. Different main targets were used for the lower layer and the upper layer. The arc currents applied to the individual targets had the same current value, namely 150 A, when forming the lower layer, and when forming the upper layer. Using the same sub-target for forming the lower layer and the upper layer, the arc current value applied to the sub-target was changed to control the existing states of the dispersed particles.

In each of the obtained samples, the shape and mean crystal width of particles constituting the coating layer were found, and the existing states of dispersed particles in the range of the entire film thickness×10 μm wide were confirmed by observing a cross section including the surface of the coating layer, under a transmission electron microscope (TEM). By observing three optional sights, the number of dispersed particles and the composition in each sight were measured, and the average value thereof was calculated. During the TEM observation, the entire compositions at three optional locations of each coating layer were measured by energy dispersive spectroscopy (EDS), and the average value of these was calculated as the composition of each coating layer. The hardness test according to the nanoindentation method was carried out using the microindentation hardness tester with a trigonal pyramid diamond indenter having the vertex angle of 115 degrees. On that occasion, the maximum load was set to 130 mN, and the maximum indentation depth was set to 500 nm. Then, the maximum indentation depth Hmax, and the indentation depth Hf after unloading were measured. An elastic recovery rate R was calculated according to the following equation:

Elastic Recovery Rate $R = (H\max - Hf)/H\max \times 100 (\%)$

Next, using the obtained end mill (Product No. 6HFSM060-170-06, manufactured by KYOCERA CORPORATION), a cutting test was carried out under the following cutting conditions. The results were shown in Table 3.
Cutting method: End milling
Workpiece: SKD64
Cutting speed: 69.7 m/min
Feed rate: 0.035 mm/rev
Depth of cut:

Depth×Side cutting=6 mm×0.18 mm

Cutting state: Dry
Evaluation method: After cutting for 90 minutes, the wear of a side flank face, the wear of a front end, and the presence or absence of chipping were measured under a microscope.

TABLE 1

| | | | Lower surface | | | | | |
|---|---|---|---|---|---|---|---|---|
| | | Arc | Columnar crystal | | Dispersed particle | | | |
| Sample No. | Bias voltage (V) | current to sub-target (A) | Composition | Mean crystal width (μm) | Distribution density (number) | Mean particle diameter (nm) | W content (atomic %) | Layer thickness $t_1$ (μm) |
| 1 | 150 | 120 | $Ti_{0.55}Al_{0.35}W_{0.04}Si_{0.04}Nb_{0.02}N$ | 0.14 | 5.7 | 45 | 12.5 | 2.5 |
| 2 | 100 | 150 | $Ti_{0.59}Al_{0.35}W_{0.04}Mo_{0.02}N$ | 0.19 | 5.0 | 62 | 14.2 | 2.5 |
| 3 | 125 | 140 | $Ti_{0.60}Al_{0.34}Mo_{0.02}W_{0.04}N$ | 0.11 | 8.3 | 51 | 13.6 | 3.1 |
| 4 | 200 | 175 | $Ti_{0.52}Al_{0.35}Cr_{0.09}W_{0.04}M$ | 0.1 | 4.7 | 86 | 16.2 | 1.3 |
| 5 | 95 | 120 | $Ti_{0.65}Al_{0.30}W_{0.03}Ta_{0.02}N$ | 0.2 | 6.0 | 42 | 12.8 | 1.6 |
| 6 | 150 | 100 | $Ti_{0.56}Al_{0.30}Cr_{0.06}Si_{0.04}W_{0.04}N$ | 0.15 | 6.7 | 37 | 10.2 | 2.2 |
| 7 | 125 | 100 | $Ti_{0.48}Si_{0.40}Nb_{0.07}W_{0.05}N$ | 0.16 | 5.7 | 33 | 11.5 | 2.1 |
| 8 | 125 | 150 | $Ti_{0.55}Al_{0.35}W_{0.10}N$ | 0.18 | 8.7 | 58 | 14.1 | 3.1 |
| 9 | 100 | 75 | $Ti_{0.55}Al_{0.40}W_{0.05}C_{0.2}N_{0.8}$ | 0.15 | 11.0 | 24 | 7.5 | 2.1 |
| * 10 | 100 | 125 | $Ti_{0.41}Al_{0.50}W_{0.04}Si_{0.03}Mo_{0.02}N$ | 0.15 | 5.3 | 41 | 12.1 | 4.1 |
| * 11 | 75 | 100 | $Ti_{0.47}Al_{0.40}Cr_{0.10}W_{0.03}N$ | 0.20 | 6.7 | 56 | 10.5 | 2.2 |
| * 12 | 125 | 150 | $Ti_{0.35}Al_{0.35}Si_{0.25}Nb_{0.05}N$ | 0.14 | 3.0 | 47 | 13.7 | 2.6 |
| * 13 | 100 | 175 | $Ti_{0.43}Al_{0.50}W_{0.05}Mo_{0.02}N$ | 0.18 | 5.3 | 41 | 15.6 | 2.9 |
| * 14 | 75 | — | $Ti_{0.40}Al_{0.30}Si_{0.20}Cr_{0.10}N$ | 0.28 | — | — | — | 3.1 |

Mark * indicates sample out of range of this invention

TABLE 2

| | | | Upper layer | | | | | | |
|---|---|---|---|---|---|---|---|---|---|
| | | Arc | Columnar crystal | | Dispersed particle | | | | Total |
| Sample No. | Bias voltage (V) | current to sub-target (A) | Composition | Mean crystal width (μm) | Distribution density (number) | Mean particle diameter (nm) | W content (atomic %) | Layer thickness $t_1$ (μm) | thickness of coating layer (μm) |
| 1 | 175 | 100 | $Ti_{0.52}Al_{0.36}Nb_{0.15}Si_{0.02}N$ | 0.11 | 3.0 | 41 | 10.6 | 2.7 | 5.2 |
| 2 | 120 | 100 | $Ti_{0.59}Al_{0.35}Mo_{0.05}N$ | 0.13 | 2.7 | 40 | 13.2 | 2.8 | 5.3 |
| 3 | 150 | 75 | $Ti_{0.52}Al_{0.39}Mo_{0.09}N$ | 0.09 | 3.7 | 35 | 12.6 | 3.6 | 6.7 |
| 4 | 225 | 125 | $Ti_{0.57}Al_{0.38}Cr_{0.05}N$ | 0.07 | 2.0 | 40 | 10.5 | 2.1 | 3.4 |
| 5 | 105 | 100 | $Ti_{0.55}Al_{0.35}Ta_{0.10}N$ | 0.12 | 3.3 | 30 | 11.8 | 1.6 | 3.2 |
| 6 | 200 | 75 | $Ti_{0.46}Al_{0.36}Cr_{0.08}Si_{0.05}Hf_{0.05}N$ | 0.11 | 4.0 | 27 | 8.8 | 3.6 | 5.8 |
| 7 | 150 | 100 | $Ti_{0.43}Si_{0.40}Nb_{0.17}N$ | 0.14 | 3.7 | 30 | 10.5 | 2.6 | 4.7 |
| 8 | 175 | 175 | $Ti_{0.50}Al_{0.50}N$ | 0.11 | 5.7 | 100 | 14.8 | 3.6 | 6.7 |
| 9 | 120 | 50 | $Ti_{0.45}Al_{0.55}C_{0.4}N_{0.8}$ | 0.13 | 2.3 | 10 | 2.5 | 1.9 | 4.0 |
| * 10 | | | | | — | | | | 4.1 |
| * 11 | 75 | 125 | $Ti_{0.40}Al_{0.40}Cr_{0.12}W_{0.08}N$ | 0.24 | 4.0 | 54 | 8.4 | 2.0 | 4.2 |
| * 12 | 125 | 50 | $Ti_{0.45}Al_{0.30}Si_{0.20}Nb_{0.05}N$ | 0.14 | 1.7 | 53 | 3.8 | 2.8 | 5.4 |
| * 13 | 100 | 190 | $Ti_{0.43}Al_{0.50}W_{0.05}Mo_{0.02}N$ | 0.13 | 5.3 | 37 | 14.2 | 2.6 | 5.5 |
| * 14 | 75 | 100 | $Ti_{0.35}Al_{0.30}Si_{0.25}Cr_{0.10}N$ | 0.29 | 4.0 | 57 | 11.6 | 3.5 | 6.6 |

Mark * indicates sample out of range of this invention

TABLE 3

| Sample No. | Elastic recovery rate of coating layer (%) | Cutting properties | | |
|---|---|---|---|---|
| | | Arc current to sub-target (A) | Flank wear (mm) | Top wear (mm) |
| 1 | 44.7 | Absence | 0.12 | 0.15 |
| 2 | 45.1 | Absence | 0.14 | 0.17 |
| 3 | 43.6 | Absence | 0.26 | 0.27 |
| 4 | 42.5 | Absence | 0.13 | 0.17 |
| 5 | 46.8 | Absence | 0.25 | 0.3 |
| 6 | 46.7 | Absence | 0.21 | 0.21 |
| 7 | 47.0 | Absence | 0.15 | 0.19 |
| 8 | 48.9 | Absence | 0.26 | 0.29 |
| 9 | 41.2 | Whit presence | 0.22 | 0.26 |
| *10 | 30.5 | Early fracture | — | — |
| *11 | 33.7 | Presence | 0.34 | 0.41 |
| *12 | 41.2 | Whit presence | 0.56 | 0.59 |
| *13 | 21.3 | Presence | 0.45 | 0.45 |
| *14 | 26.7 | Presence (peeling) | 0.46 | 0.51 |

Mark * indicates sample out of range of this invention

The results in Tables 1 to 3 showed the following points. That is, Sample No. 10 with the single coating layer was fractured early. In Sample No. 11 in which the mean crystal width of the upper layer was larger than the mean crystal width of the lower layer, and in Sample No. 12 in which the mean crystal width of the upper layer was the same as the mean crystal width of the lower layer, chipping and considerable wear were observed at their respective cutting edges. In Sample No. 13 in which the lower layer and the upper layer had the same distribution density of dispersed particles, chipping was observed at the cutting edge. In Sample No. 14 in which no dispersed particle existed in the lower layer, chipping due to the peeling of the coating layer was observed.

On the contrary, in all of Samples Nos. 1 to 9 within the scope of the present invention, their respective coating layers had excellent fracture resistance and oxidation resistance, thereby exhibiting satisfactory cutting performance.

EXPLANATION OF SYMBOLS 1, 15 Cutting tool
2 Substrate
3 Rake face
4 Flank face
5 Cutting edge
6 Coating layer
8 Lower layer
9 Upper layer
10 Columnar particle
10a Columnar particle of lower layer
10b Columnar particle of upper layer
12 Dispersed particle
12a Dispersed particle of lower layer
12b Dispersed particle of upper layer
20 AIP device
21 Vacuum chamber
22 Gas inlet
23 Cathode electrode
24 Anode electrode
25 Main target
25a Main target of lower layer
25b Main target of upper layer
26 Sample support
27 Tower
28 Table
29 Heater
30 Gas discharge port
31 Bias power supply
32 Sub-target

The invention claimed is:

1. A surface-coated tool comprising:
a substrate; and
a coating layer coating a surface of the substrate, wherein the coating layer comprises a lower layer and an upper layer,
the lower layer and the upper layer are both composed of columnar particles extending vertically with respect to the surface of the substrate, a mean crystal width of the columnar particles of the upper layer being smaller than a mean crystal width of the columnar particles of the lower layer, and
the lower layer and the upper layer both comprise dispersed particles containing tungsten, a distribution density of the dispersed particles in the upper layer being smaller than a distribution density of the dispersed particles in the lower layer,
wherein a mean particle diameter of the dispersed particles is 10 nm-100 nm.

2. The surface-coated tool according to claim 1, wherein a mean particle diameter of the dispersed particles in the upper layer is smaller than a mean particle diameter of the dispersed particles in the lower layer.

3. The surface-coated tool according to claim 1, wherein the dispersed particles in the lower layer contain more tungsten than the dispersed particles in the upper layer.

4. The surface-coated tool according to claim 1, wherein, on a surface of the coating layer, an elastic recovery rate by a hardness measurement using nanoindentation method is 40 to 50%.

5. The surface-coated tool according to claim 2, wherein the dispersed particles in the lower layer contain more tungsten than the dispersed particles in the upper layer.

6. The surface-coated tool according to claim 2, wherein, on a surface of the coating layer, an elastic recovery rate by a hardness measurement using nanoindentation method is 40 to 50%.

7. The surface-coated tool according to claim 3, wherein, on a surface of the coating layer, an elastic recovery rate by a hardness measurement using nanoindentation method is 40 to 50%.

* * * * *